United States Patent
Ueda (10) Patent No.: US 7,615,460 B2
(45) Date of Patent: Nov. 10, 2009

(54) HARD MASK TECHNIQUE IN FORMING A PLUG

(75) Inventor: Yasuhiko Ueda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 282 days.

(21) Appl. No.: 11/418,074

(22) Filed: May 5, 2006

(65) Prior Publication Data

US 2006/0255386 A1    Nov. 16, 2006

(30) Foreign Application Priority Data

May 11, 2005    (JP)    ............................. 2005-138805

(51) Int. Cl.
*H01L 21/20*    (2006.01)
(52) U.S. Cl. .................. 438/387; 257/E21.396
(58) Field of Classification Search ................ 438/243, 438/253, 386, 381, 387; 257/E21.396
See application file for complete search history.

(56) References Cited

U.S. PATENT DOCUMENTS

| | | | |
|---|---|---|---|
| 6,197,653 B1 * | 3/2001 | Khamankar et al. | 438/398 |
| 6,294,426 B1 * | 9/2001 | Tu et al. | 438/255 |
| 7,112,504 B2 * | 9/2006 | Hsin et al. | 438/386 |
| 7,130,182 B2 * | 10/2006 | Balster et al. | 361/321.1 |
| 2002/0151152 A1 * | 10/2002 | Shimamoto et al. | 438/398 |

FOREIGN PATENT DOCUMENTS

JP    11-354499    12/1999

* cited by examiner

*Primary Examiner*—W. David Coleman
(74) *Attorney, Agent, or Firm*—McGinn IP Law Group, PLLC (57) ABSTRACT

A method for manufacturing a semiconductor device includes the steps of forming a conductive hard mask coupled to the semiconductor substrate via discharge plugs on a thick insulating film, selectively etching the thick insulating film by using the conductive hard mask to form cylindrical holes in the thick insulating film. The resultant cylindrical holes are free form bowing structure.

18 Claims, 11 Drawing Sheets

HARD MASK TECHNIQUE IN FORMING A PLUG

BACKGROUND OF THE INVENTION (a) Field of the Invention

The present invention relates to a method for manufacturing a semiconductor device having a hard mask coupled to a discharge plug and, more particularly, to a technique for forming a cylindrical hole receiving therein a via-plug or a stacked capacitor by using a hard mask.

(b) Description of the Related Art

A DRAM device has an increasing number of memory cells by employing a reduced design rule. The reduced design rule inevitably reduces the occupied area of each memory cell, and thus requires a reduced occupied area for a stacked capacitor used in the memory cell without reducing the capacitance thereof. A cylindrical capacitor is generally used as the stacked capacitor for storing data in a memory cell, to achieve a reduced occupied area and yet a larger capacitance. The cylindrical capacitor is generally received in a cylindrical hole, and includes a bottom electrode formed on the bottom and sidewall of the cylindrical hole, a capacitor insulation film formed thereon, and a top electrode filling the cylindrical hole to oppose the bottom electrode with an intervention of the capacitor insulation film. In general, a larger depth for the cylindrical hole receiving therein the stacked capacitor provides a larger capacitance for the stacked capacitor.

Figure 6:
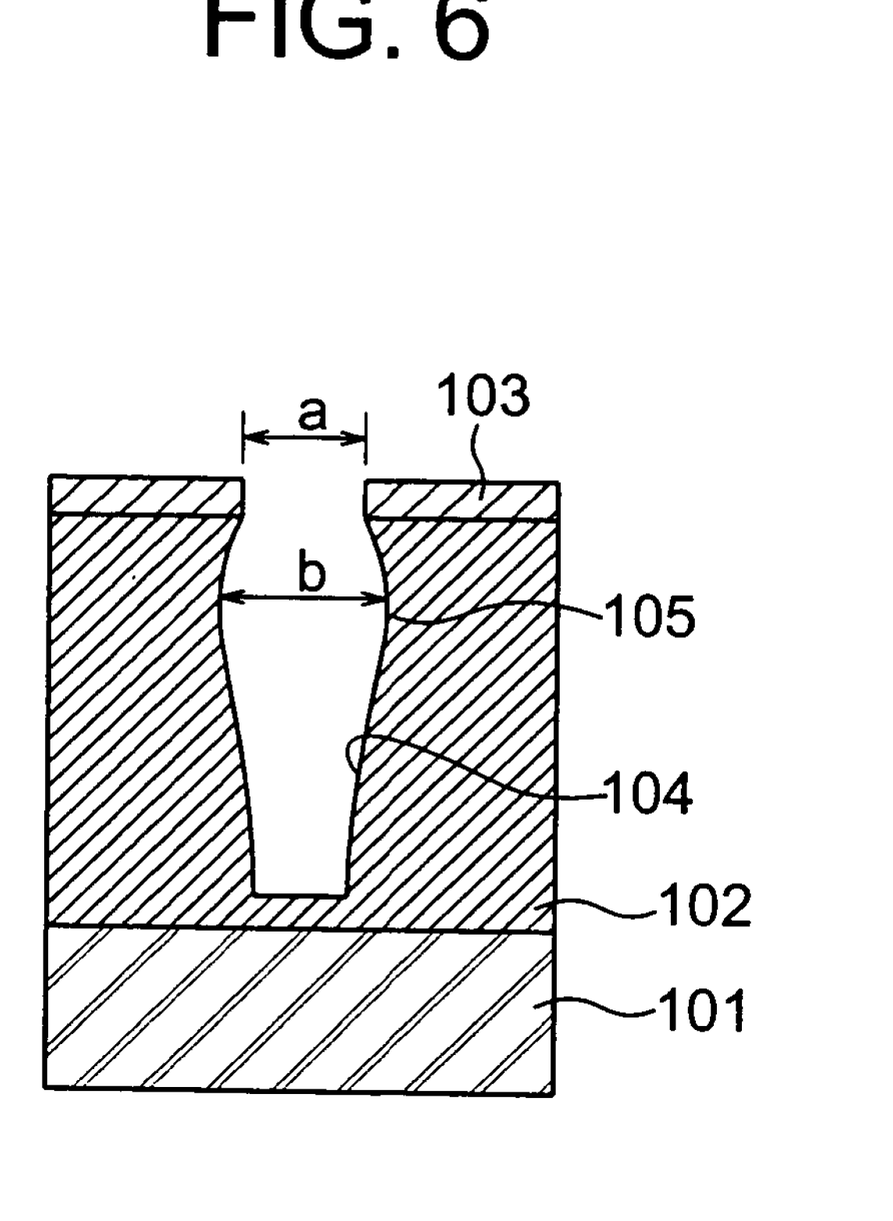
FIG. 6 is a sectional view of a semiconductor device in a conventional method involving a malfunction.

However, the larger depth for the cylindrical hole may involve a bowing structure of the cylindrical hole such as shown in FIG. 6. More specifically, the increase of the depth for the cylindrical hole 104 causes the bowing structure wherein a larger side etch of the cylindrical hole 104 generates an increased width of the cylindrical hole 104 at a specific depthwise position 105 near the top of the cylindrical hole. In the same drawing, 101, 102 and 103 denote a silicon substrate, a thick insulation film receiving therein the cylindrical hole 104, and a hard mask used for etching for forming the cylindrical hole 104, respectively. The bowing structure causes a malfunction of a smaller thickness of the insulation film between the bottom electrodes of adjacent capacitors, and may eventually cause a short-circuit failure between bottom the electrodes.

The reason for occurring of the bowing structure is such that a larger depth of the cylindrical hole involves a smaller etch rate in the vicinity of the bottom of the cylindrical hole, and increases the time length of etching for the cylindrical hole to thereby increase the side etch at the specific depthwise position. Patent Publication JP-11-354499A, for example, describes a technique for suppressing the bowing structure, wherein an etching gas including $CHF_3$ and CO used in a dry etching process allows a carbon-rich film to be deposited on the sidewall of the cylindrical hole, the carbon-rich film acting as a protective film for the sidewall to suppress the side etch of the cylindrical hole.

Recent giga-bit-class DRAM devices having a reduced design rule of 0.1 µm include a cylindrical hole having a depth of 2.5 to 3.0 µm, a diameter of 0.16 µm, and thus an aspect ratio of 15 to 19. In this range of the aspect ratio, even the technique described in the above publication cannot effectively suppress occurring of the bowing structure even if the etching gas is optimized for the dry etching.

The present inventor presumed that the bowing structure for the case of a high aspect ratio resulted from the profile of the amount of a polymer, which is generated during the dry etching and deposited onto the sidewall of the cylindrical hole. In this presumption, it was noted that the thick insulation film made of $SiO_2$ and receiving therein the cylindrical hole generates the polymer as the product of reaction between the $SiO_2$ film and the fluorocarbon (CxFy) used in the etching gas, that the polymer having a high deposition rate has a tendency of attachment onto the sidewall in the vicinity of top of the cylindrical hole, resulting in that the specific depthwise position of the cylindrical hole was attached with a less amount of polymer and thus rapidly etched by the side etch. However, a sample including a cylindrical hole having a depth of 2.5 µm and exposed to gas plasma using a CF-containing gas exhibited that the above presumption was not correct, because a sufficient amount of polymer was observed as attached onto the area of the cylindrical hole from the vicinity of the top to the center thereof.

SUMMARY OF THE INVENTION

In view of the above, it is an object of the present invention to provide a method for manufacturing a semiconductor device including a cylindrical hole having a higher aspect ratio and capable of suppressing the occurrence of the bowing structure.

The present invention provides a method for manufacturing a semiconductor device including: forming an insulating film overlying a semiconductor substrate; forming an electrode plug penetrating the insulating film to reach the semiconductor substrate; forming a mask pattern on the insulating film and on top of the electrode plug; selectively etching the insulating film by a dry etching using the mask pattern as an etching mask to form therein a cylindrical hole; and forming a first electrode on an internal surface of the cylindrical hole.

In accordance with the method of the present invention, electric charge electrifying the mask pattern is discharged to the semiconductor substrate via the electrode plug during patterning of the insulation film in the selective etching using the mask pattern as an etching mask. This prevents ions used in the dry etching from being deflected by the mask pattern and impinging upon the sidewall of the cylindrical hole, thereby suppressing occurrence of the bowing structure in the cylindrical hole. The term "cylindrical hole" as used in this text includes any hole such as referred to as contact hole, via-hole, through-hole, which may have a relatively large depth and thus involve a bowing structure. The cross-section of the cylindrical hole is not limited to any shape and may be a circle, ellipse or polygon, for example.

The present invention also provides a method for manufacturing a semiconductor package including: manufacturing first and second semiconductor devices by using the above-described method, and stacking the first semiconductor device onto the second semiconductor device so that the electrode plug of the first semiconductor device is in contact with the electrode plug of the second semiconductor device.

In the semiconductor package manufactured by the present invention, the electrode plug can be used as a power source electrode, ground electrode or signal electrode connecting together the first and second semiconductor devices.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1:
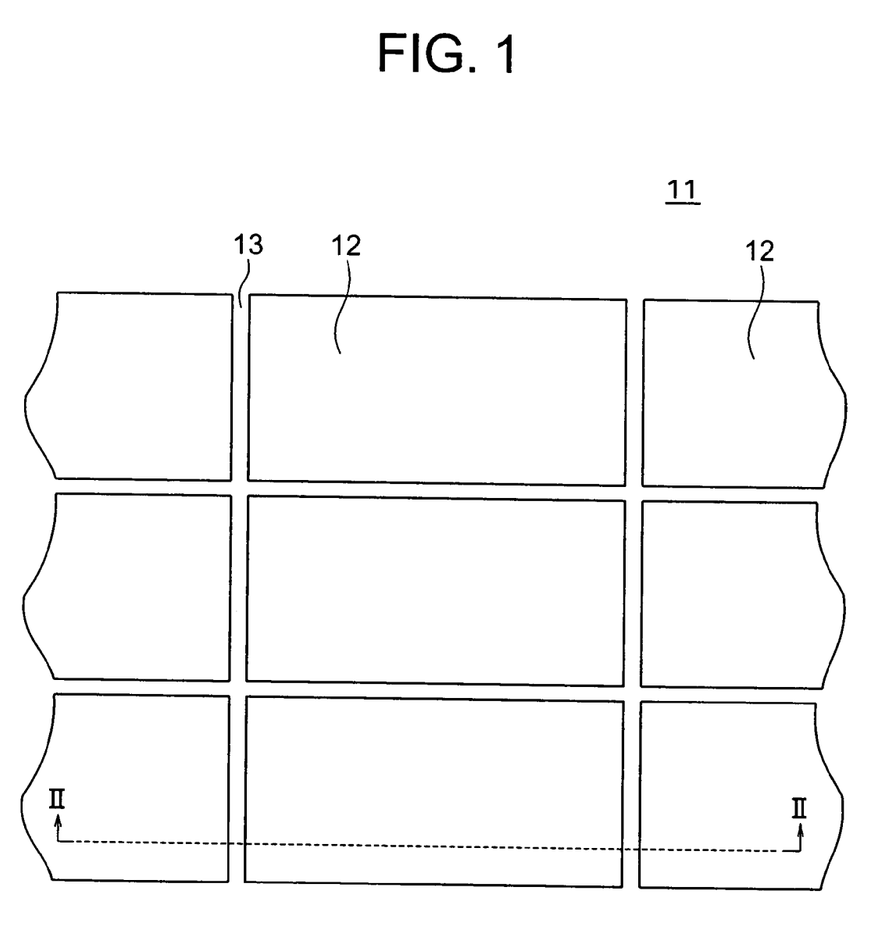
FIG. 1 is a top plan view of a semiconductor wafer in a step of fabrication of semiconductor devices on the semiconductor wafer according to a first embodiment of the present invention.

FIG. 1 shows a top plan view illustrating a fabrication step of DRAM devices shown as semiconductor devices manufactured on a semiconductor wafer by a method according to a first embodiment of the present invention. In the process, the main surface of a silicon wafer 11 made of single-crystalline silicon is first divided into a plurality of chip areas 12 in which respective semiconductor chips are to be formed, and a plurality of scribe areas 13 along which the semiconductor wafer 11 is to be divided in a dicing step to obtain separate semiconductor chips. The chip areas 12 are of a rectangular shape having a side of 2 centimeters or smaller. The silicon wafer 11 has a diameter of 300 mm, and about 1000 chip areas 12 are obtained therein.

Figure 2A:
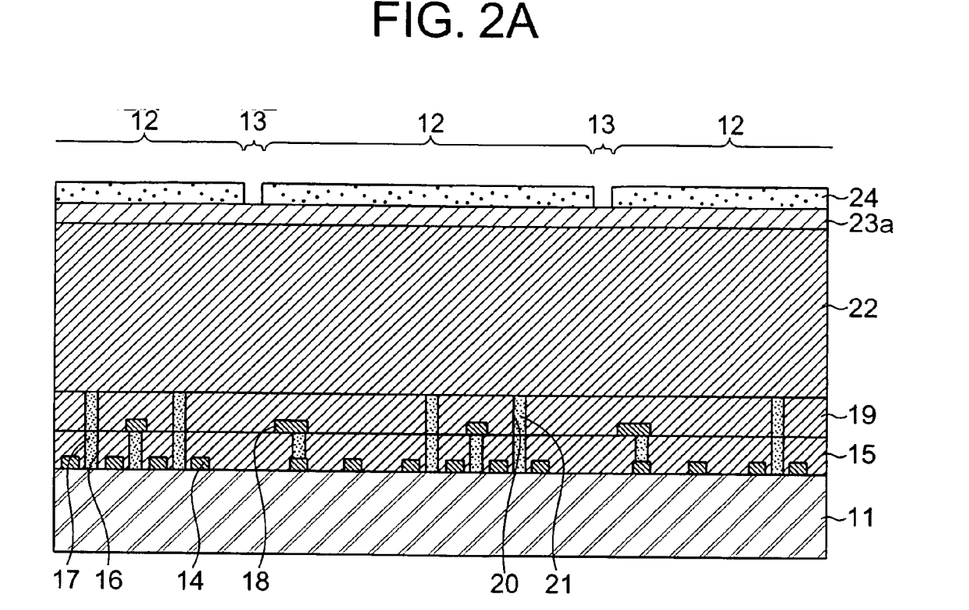
FIGS. 2A to 2H are sectional views consecutively showing fabrication steps of the semiconductor devices in the method of the first embodiment.
Figure 2B:
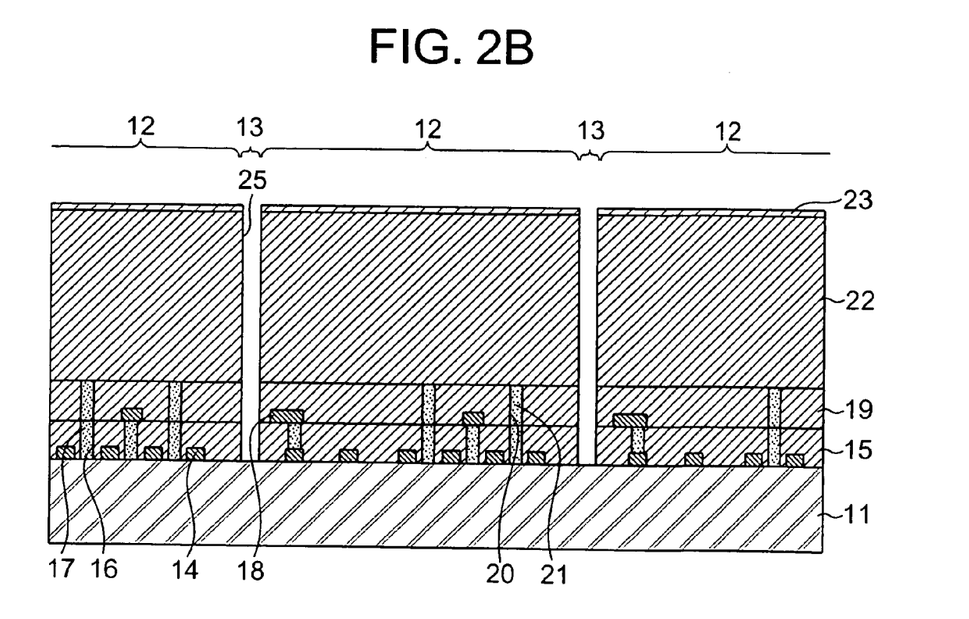
Figure 2C:
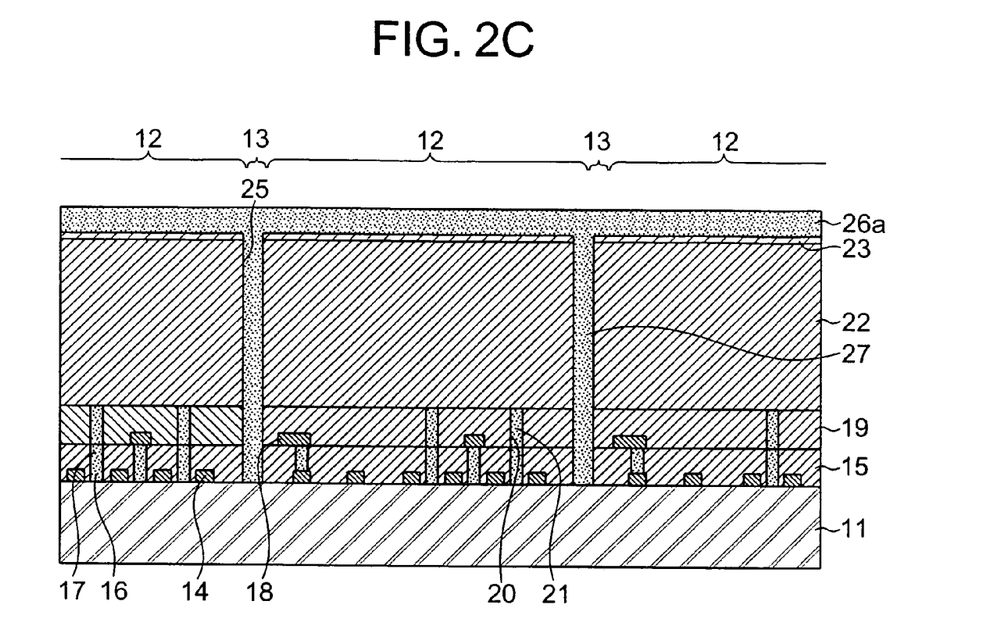
Figure 2D:
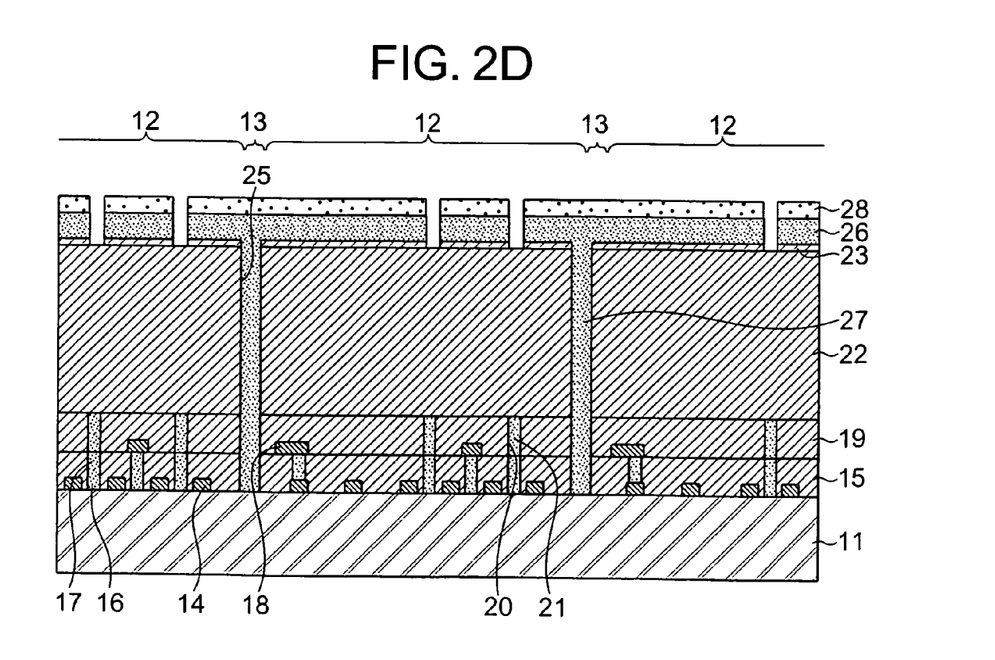
Figure 2E:
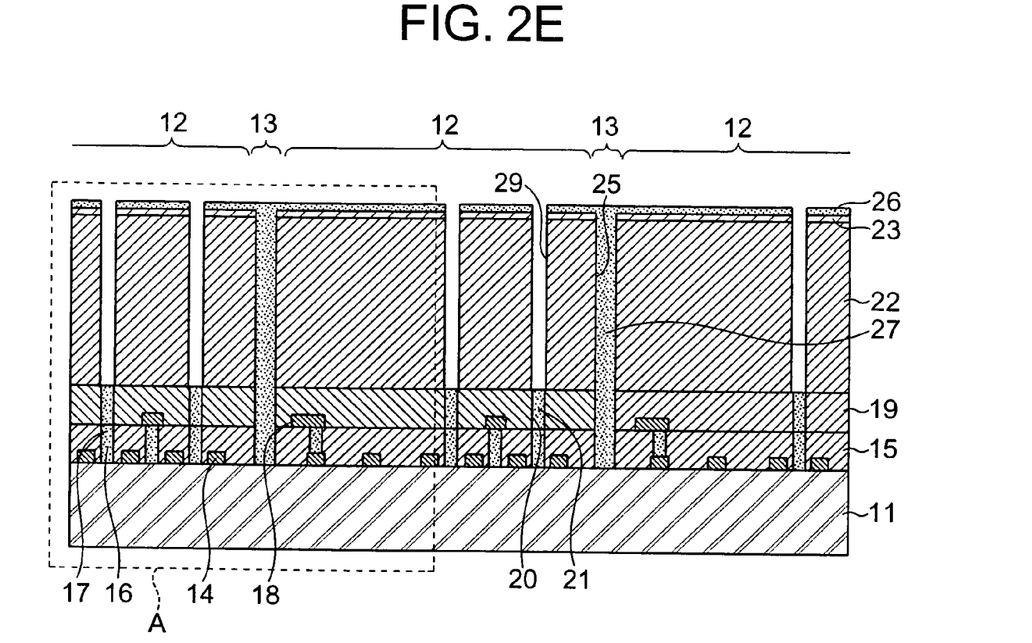
Figure 2F:
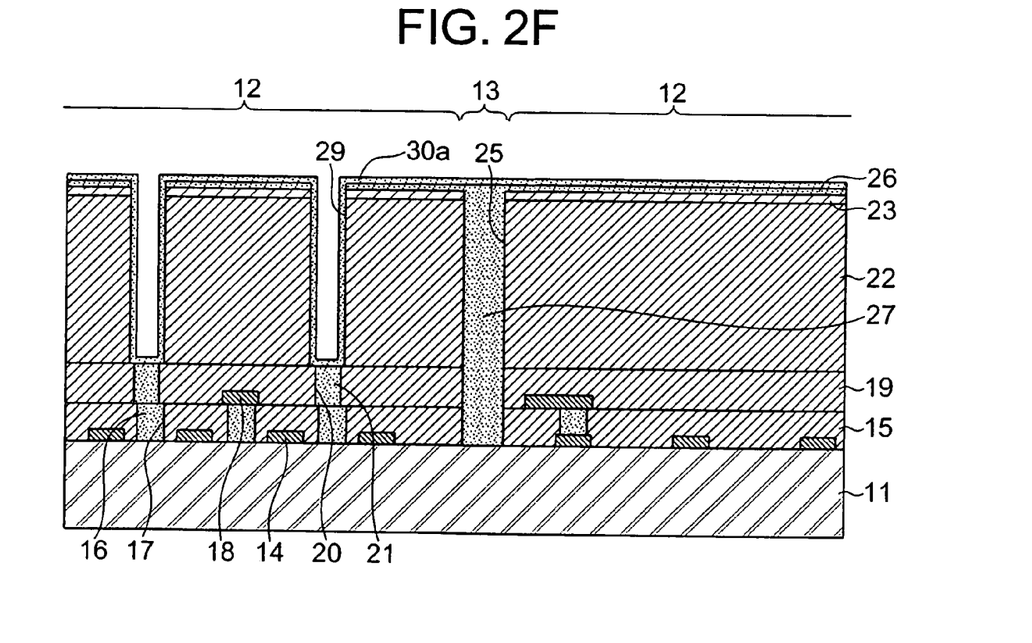
Figure 2G:
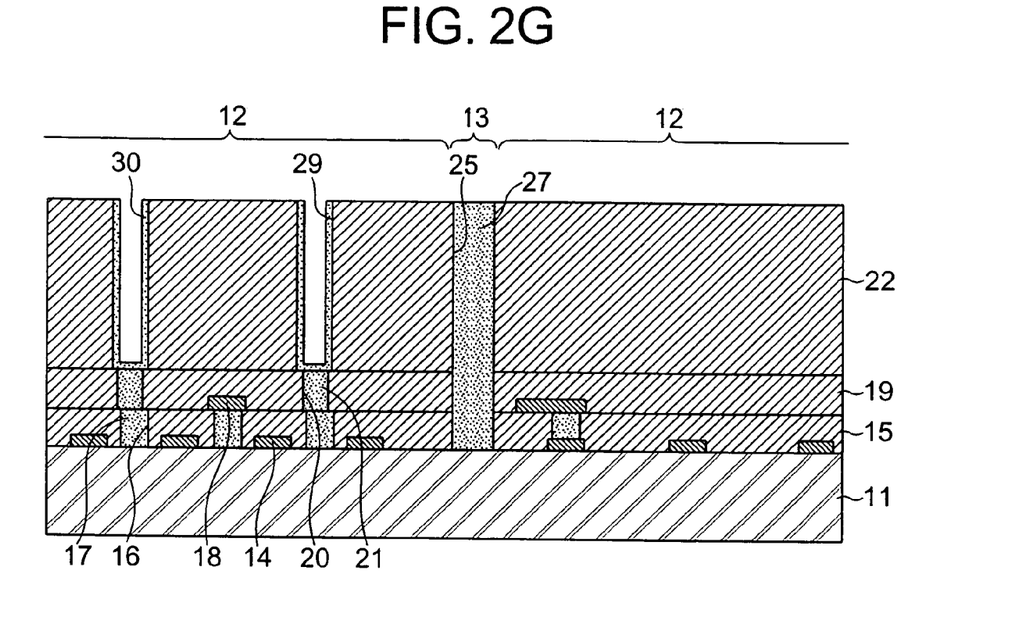

FIGS. 2A to 2H are sectional views taken long line II-II in FIG. 1, consecutively showing the steps for fabrication of a semiconductor devices on the wafer. FIGS. 2A to 2E show the section taken along line II-II, and FIGS. 2F to 2G show enlarged views of the part marked with sign "A" in FIG. 2E. First, well regions and element isolation regions are formed on the surface of the chip areas 12 of the semiconductor wafer 11 shown in FIG. 2A. Subsequently, a first level interconnect layer is formed to overlie the semiconductor wafer 11 by using a known technique, followed by selective etching to form first level interconnects 14 such as word lines therefrom. Impurities are then implanted using the word lines etc. as an implantation mask, thereby forming diffused regions (not shown) in the chip areas 12 of the semiconductor wafer 11 in a self-alignment process.

Thereafter, a first interlevel dielectric film 15 is deposited on the first level interconnects 14, and subjected to a CMP process for planarization of the surface thereof. The first interlevel dielectric film 15 is then selectively etched to form therethrough contact holes 16, which are filled with a conductive material to form therein contact plugs 17. Subsequently, second level interconnects 18 configuring bit lines etc. is formed on the first interlevel dielectric film 15 to connect to the contact plugs 17.

Thereafter, a second interlevel dielectric film 19 is deposited to cover the second level interconnects 18 on the first interlevel dielectric film 15, followed by CMP thereof for planarization. The second interlevel dielectric film 19 is then selectively etched to form therethrough via-holes 20, which are filled with a conductive material to form therein via-plugs 21.

A thick insulation film 22 made of silicon oxide having a thickness of 3 μm for forming therein cylindrical holes is then deposited on the second interlevel dielectric film 19 by using a plasma-enhanced CVD technique. The thick insulation film 22 may include a silicon nitride and/or BPSG (boro-phospho-silicate glass) film in addition to the silicon oxide film. Thereafter, a silicon film 23a is deposited on the thick insulation film 22 to a thickness of 0.5 μm. A photoresist film is then formed thereon and patterned using a photolithographic technique to configure a resist mask 24 having openings extending along the scribe areas 13. The thus obtained structure is shown in FIG. 2A.

Thereafter, a hard mask 23 is formed by patterning the silicon film 23a by using a dry etching technique. The hard mask 23 is then used in another dry etching step to selectively etch the thick insulation film 22, second interlevel dielectric film 19 and first interlevel dielectric film 15, thereby forming trenches 25 penetrating those films 22, 19, 15 to reach the surface of the semiconductor substrate 11 in the scribe areas 13, as shown in FIG. 2B.

In the formation of the trenches 25, a plasma-enhanced etching system having parallel electrodes is employed, wherein a mixture of $C_4F_6$, Ar and $O_2$ is used, with the gas pressure at 25 mTorr, the high-frequency power at 3 kW and the bias power at 3.4 kW. The trenches 25 have an aspect ratio lower than 14.

Subsequently, as shown in FIG. 2C, a conductive film 26a made of impurity-doped silicon is deposited within the trenches 25 and on the hard mask 23 to a thickness of 0.5 μm on the hard mask 23. In this deposition, monosilane ($SiH_4$) and phosphine ($PH_3$) are used as the source gas, and the substrate temperature is maintained at 530 degrees C. By adjusting the flow rate of the $PH_3$, the impurity concentration of the conductive film 26a is set at $3 \times 10^{20}$ $cm^{-3}$. The portion of the conductive film 26a deposited within the trenches 25 will function as a discharge plug (electrode plug) 27.

Thereafter, a heat treatment is conducted at a substrate temperature of 700 degrees C. for 3 minutes, whereby the amorphous silicon configuring the conductive film 26a is polycrystallized. The polycrystallization of the amorphous silicon well reduces the specific resistance of the conductive film 26a down to 300 μΩ·cm.

If the silicon is deposited at a substrate temperature of 600 degrees C. or above, a polysilicon film can be obtained without the need of the heat treatment. However, deposition of the amorphous silicon film followed by the heat treatment allows the surface of the resultant polysilicon film to have a more even surface to some extent. In addition, the resultant polysilicon film has a larger grain size and thus has a lower specific resistance compared to the as-deposited polysilicon film.

In the above process, both the conductive film 26a and hard mask 23 are made of silicon. However, if the hard mask 23 is made of a material other than the silicon, the hard mask is preferably removed prior to deposition of the conductive film 26a.

Thereafter, a photoresist film is deposited on the conductive film 26a, and patterned using a photolithographic technique, thereby forming a photoresist mask 28 having a plurality of openings corresponding to desired cylindrical holes. The openings are of a circle having a diameter of 0.16 μm. The patterning for the photoresist is conducted using an orbicular-zone illumination system including a KrF laser source having a wavelength of 0.248 μm. Subsequently, the conductive film 26a and hard mask 23 are patterned by a dry etching using the photoresist mask 28 as an etching mask, to thereby obtain the structure shown in FIG. 2D. The conductive film 26a thus patterned configures a conductive hard mask 26.

Thereafter, as shown in FIG. 2E, the thick insulation film 22 is patterned by a dry etching using the conductive hard mask 26a as an etching mask, to thereby form cylindrical holes 29 in the thick insulation film 22. The conditions in this dry etching are similar to those used in the formation of the trenches 25. The cylindrical holes 29 have a depth of 3 μm and a diameter of 0.16 μm, and thus have an aspect ratio of around 19. The gap between adjacent cylindrical holes is around 0.065 μm. Subsequently, the top of the via-plugs 21 exposed from the bottom of the cylindrical holes 29 are cleaned.

Thereafter, as shown in FIG. 2F, another conductive film 30a made of impurity-doped amorphous silicon is deposited by a CVD technique on the surface of the bottom and sidewall of the cylindrical holes 29 to a thickness of 0.03 μm. The deposition of the another conductive film 30a is conducted under the conditions similar to those used in deposition of the conductive film 26a. Subsequently, a heat treatment is conducted to polycrystallize the amorphous silicon to reduce the specific resistance of the another conductive film 30a.

Thereafter, as shown in FIG. 2G, a CMP process is conducted to remove the hard mask 23, conductive hard mask 26 and a portion of the another conductive film 30a on top of the thick insulation film 22, while leaving a portion of the another conductive film 30a within the cylindrical holes 29 as the bottom electrode 30. It is to be noted here that the bottom electrode 30 may be made of a metal compound such as titanium nitride or titanium tungsten instead of the polysilicon. In addition, the CMP process may be replaced by a dry etching process for removing the films on top of the thick insulation film 22.

Thereafter, a silicon nitride film and a tantalum oxide film are consecutively deposited on the entire surface including the internal of the cylindrical holes 29, thereby forming an insulation film (not shown). Subsequently, another conductive film made of titanium nitride is deposited on the insulation film, to fill the cylindrical holes 29 and overlie the thick insulation film 22. The another conductive film and the underlying insulation film are then patterned using a known photolithographic technique, whereby the top electrode (plate electrode) 31 and capacitor insulation film (not shown) are obtained. The capacitor insulation film may be made of aluminum oxide deposited using an ALD (atomic-layer deposition) technique, whereas the bottom electrode 31 may be made of tungsten or may have a two-layer structure including titanium nitride and tungsten layers.

Figure 2H:
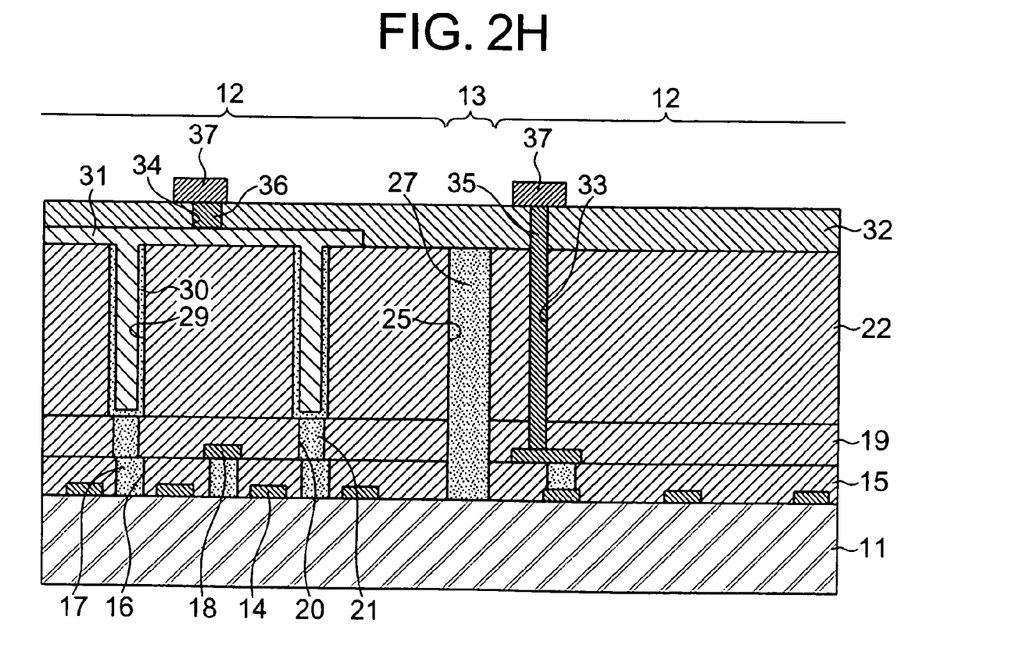

Thereafter, a third interlevel dielectric film 32 is deposited on the top electrode 31 and the thick insulation film 22, followed by forming via-holes 33 penetrating the third interlevel dielectric film 32, thick insulation film 22 and second interlevel dielectric film 19 in the peripheral area of the DRAM. Further, via-holes 34 are formed through the third interlevel dielectric film 32 to expose therefrom the top electrode 31. The via-holes 33 and 34 are then filled with a conductive material such as tungsten to form via-plugs 35 and 36.

Third-level interconnect lines 37 made of Al are then formed on the third interlevel dielectric film 32 to connect to via plugs 35 and 26, as shown in FIG. 2H, as well as other interconnect lines to form the DRAM devices. After polishing the bottom of the wafer to reduce the thickness thereof, the wafer is divided by dicing along the scribe areas 13, to thereby obtain a plurality of semiconductor chips.

The dry etching steps as used in the above embodiment generally use a high-frequency power applied onto the semiconductor wafer mounted on a stage, to generate plasma including positive and negative ions which constitute reactive species. In this generation of plasma, electrons having a lower mass in particular move toward the semiconductor substrate while following the high-frequency power, whereby the semiconductor substrate is continuously provided with the electrons or negative charge.

In the conventional process for forming the semiconductor device, the mask used for forming the cylindrical holes are generally made of an insulating material. Thus, the mask is electrified with the negative charge during the dry etching steps using plasma, and the amount of charge increases with the elapse of the etching time. The mask electrified with the negative charge applies an attraction force to the positive ions passing through the opening of the hard mask, to deviate the direction of the positive ions from the perpendicular of the surface of the semiconductor substrate. The positive ions having a deviated direction may impinge upon the sidewall of the cylindrical holes to cause a bowing structure.

On the other hand, in the process of the present invention, the mask used for forming the cylindrical holes are configured as a conductive hard mask, which is electrically coupled to the semiconductor substrate via the discharge plug. In addition, the discharge plug is disposed at a uniform density within the surface of the semiconductor substrate. This allows the charge electrifying the hard mask to be drained toward the semiconductor substrate via the discharge plug, thereby suppressing the electrification of the hard mask in the entire area thereof. Thus, attractive force applied to the positive ions passing through the openings of the hard mask can be reduced, whereby the positive ions are more likely to impinge upon the bottom of the cylindrical holes whereby occurring of the bowing structure can be suppressed.

In the process of the above embodiment, the discharge plug is disposed along the scribe areas, and thus achieves a substantially uniform area ratio of the plug area with respect to the chip area, without degrading the area ratio of the effective chip area to the wafer area.

In the above embodiment, the conductive film 26a made of silicon is used as the hard mask 26 for etching the thick insulation film 22; however, the hard mask 26 may be formed from a metallic film such as made of tungsten, titanium or compound thereof, after removing the conductive film 26a on the thick insulation film 22 by a CMP process, for example. In addition, the conductive film 26a itself may be formed from such a metallic film. If such a metallic film is used as the conductive film 26a, the interface between the silicon substrate and the metallic film should be provided with a barrier metal such as silicide or titanium nitride.

In the above embodiment, the discharge plug is formed within the trenches formed along the scribe areas; however, a plurality of discharge plugs may be formed within a plurality of through-holes arranged along the scribe areas.

A sample of the semiconductor device of the above embodiment was manufactured, and another semiconductor device of a comparative example was also manufactured wherein the conductive film 26a configuring the hard mask 26 is replaced by an undoped silicon film in the configuration of the above embodiment. In both the semiconductor devices, the cylindrical holes were observed by a scanning microscope to detect occurrence of the bowing structure. The degree of bowing structure is estimated by the difference "D" between the distance "a" and the distance "b" shown in FIG. 6.

The results of the observation revealed that the difference "D" observed in the sample of the present embodiment was 0.004 μm which is almost the detection limit by the scanning microscope, whereas the difference "D" in the comparative example was around 0.06 μm. Thus, the process of the above embodiment effectively suppressed occurrence of the bowing structure.

Assuming that the gap between adjacent cylindrical holes in both the sample and the comparative example is 0.07 μm, the bottom electrodes in the adjacent cylindrical holes may cause a short-circuit failure in the comparative example. The sample of the present embodiment is free from such a short-circuit failure due to suppression of occurring of the bowing structure. Thus, the present embodiment allows the semiconductor device to have a higher density for the memory cells having the capacitor.

It may be considered that the charge electrifying the hard mask may be drained via the edge of the wafer toward the wafer stage on which the wafer is mounted. However, it is difficult to effectively drain the charge from the hard mask via the edge of the wafer, because the wafer has a large chip area. In particular, the dry etching systems now used in the semiconductor manufacturer will not allow the edge of the wafer to be in electric contact with the wafer stage, and it is also difficult to electrically connect the edge of the wafer to the wafer stage.

Figure 3:
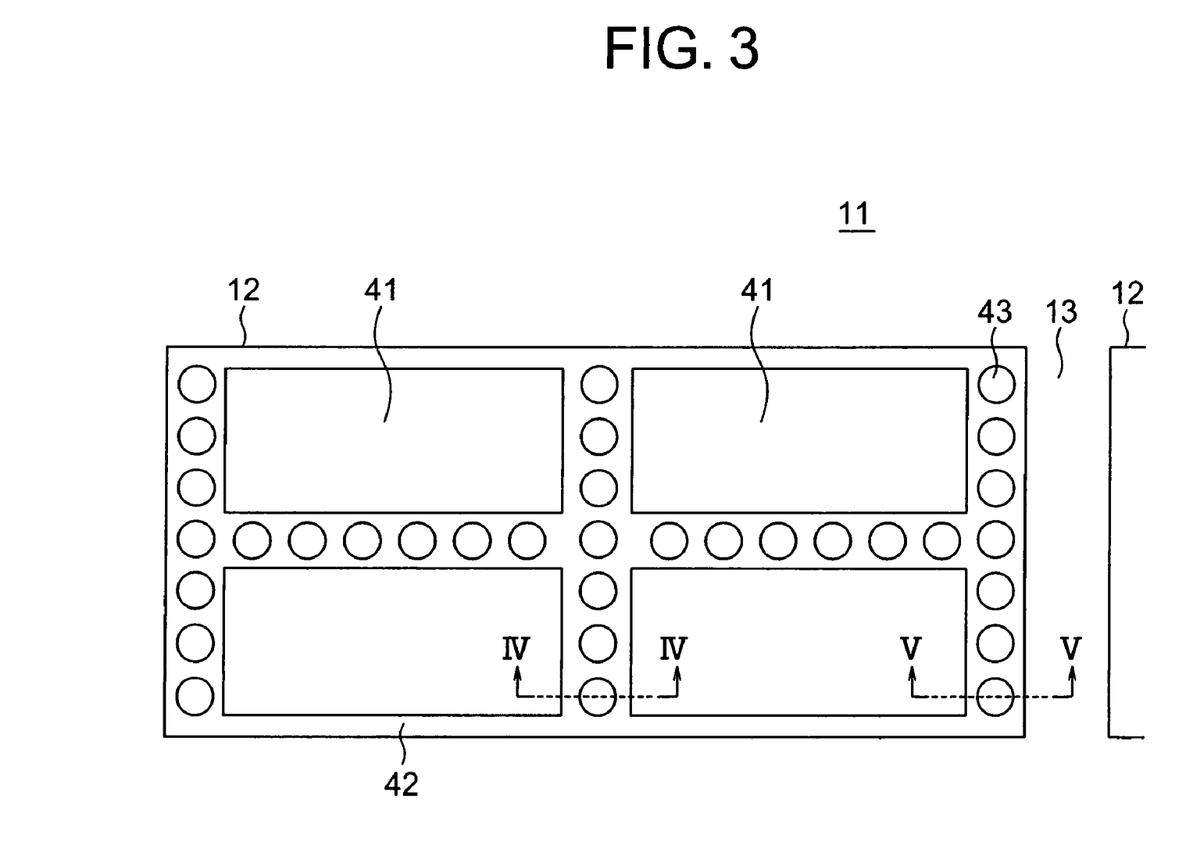
FIG. 3 is a top plan view of a semiconductor device in a step of fabrication of semiconductor devices on the semiconductor wafer according to a second embodiment of the present invention.

FIG. 3 shows a top plan view of a portion of a semiconductor wafer in a step of fabrication thereof. In this process, the semiconductor wafer 11 is separated into a plurality of chip areas 12 by using scribe areas 13. The chip areas 12 are then separated into a plurality of memory array areas 41 by using separating areas 42. The separating areas 42 are provided for receiving therein a plurality of through-holes 43 each filled with a coupling plug penetrating the semiconductor substrate 11. Each chip area 12 may include several tens or several hundreds of coupling plugs.

When a plurality of semiconductor chips are stacked one on another to form a semiconductor package, the coupling plugs formed in the through-holes 43 penetrating the semiconductor substrate 11 are coupled to the coupling plugs formed in the underlying semiconductor chip. The coupling plugs may be used as a power source line, a grand line or a signal line. The process for manufacturing the semiconductor chip shown in FIG. 3 will be detailed below with reference to FIGS. 4A to 4F, which show a sectional view taken along line IV-IV in FIG. 3.

Figure 4A:
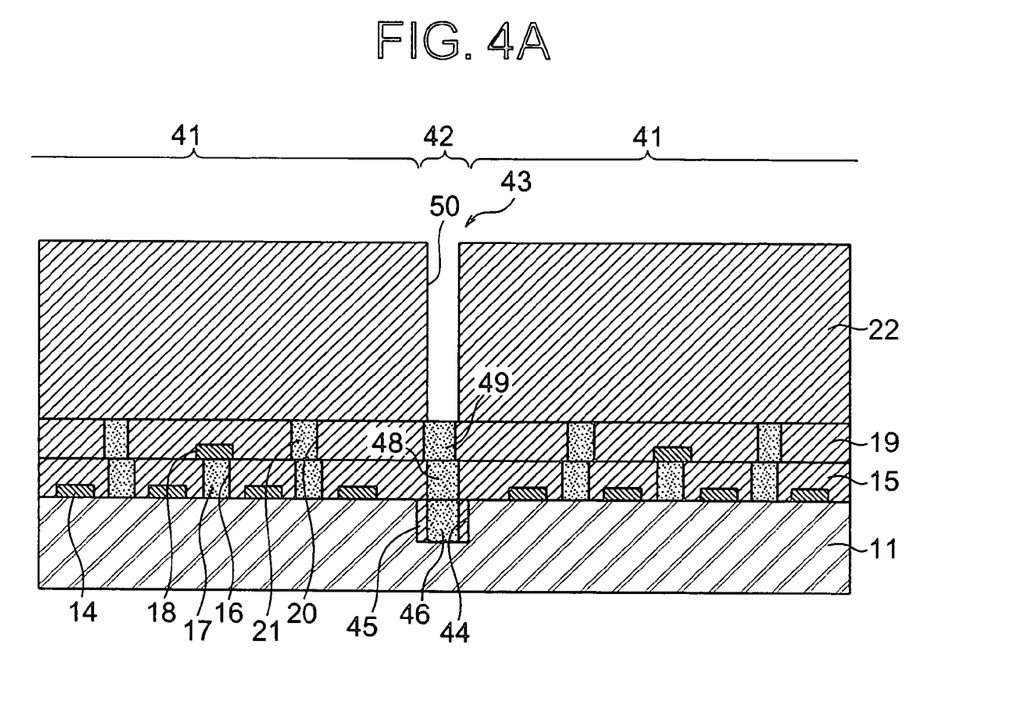
FIGS. 4A to 4F are sectional views consecutively showing fabrication steps of a semiconductor device in the method of the second embodiment.

After separating the chip area 12 into the memory array areas 41 by using the separating area 42, well regions and element isolation regions are formed on the surface area of the semiconductor chip 11. A plurality of circular trenches 44 having a depth of 50 μm are then formed in the separating area 42 of the surface region of the semiconductor substrate 11. Subsequently, a sidewall insulating film 45 is formed on the sidewall of the circular trenches 44, followed by filling the circular trenches 44 with impurity-doped polysilicon deposited on the sidewall insulating film 45, thereby forming embedded electrodes 46.

Thereafter, similarly to the first embodiment, first level interconnects 14, diffused regions (not shown), first interlevel dielectric film 15 and contact plugs 17 are consecutively formed in the chip areas 12. During formation of the contact plugs 17, first level electrode plugs 48 are also formed on top of the embedded electrodes 46. Subsequently, similarly to the first embodiment, second level interconnects 18, a second interlevel dielectric film 19 and via-plugs 21 are consecutively formed. During formation of the via-plugs 21, second level electrode plugs 49 are formed on top of the first level electrode plugs 48. Further, a thick insulation film 22 made of silicon oxide is deposited on the second interlevel dielectric film 19.

Thereafter, a silicon film and a photoresist film are consecutively formed on the thick insulation film 22. The photoresist film is then patterned to form a photoresist mask (not shown) having openings therein for forming through-holes 43. The silicon film on the thick insulation film 22 is then patterned using the photoresist mask to form a hard mask (not shown). The thick insulation film 22 is then patterned by a dry etching process using the hard mask to form a plurality of plug holes 50 exposing therethrough top of the second level electrode plugs 49, as shown in FIG. 4A.

Figure 4B:
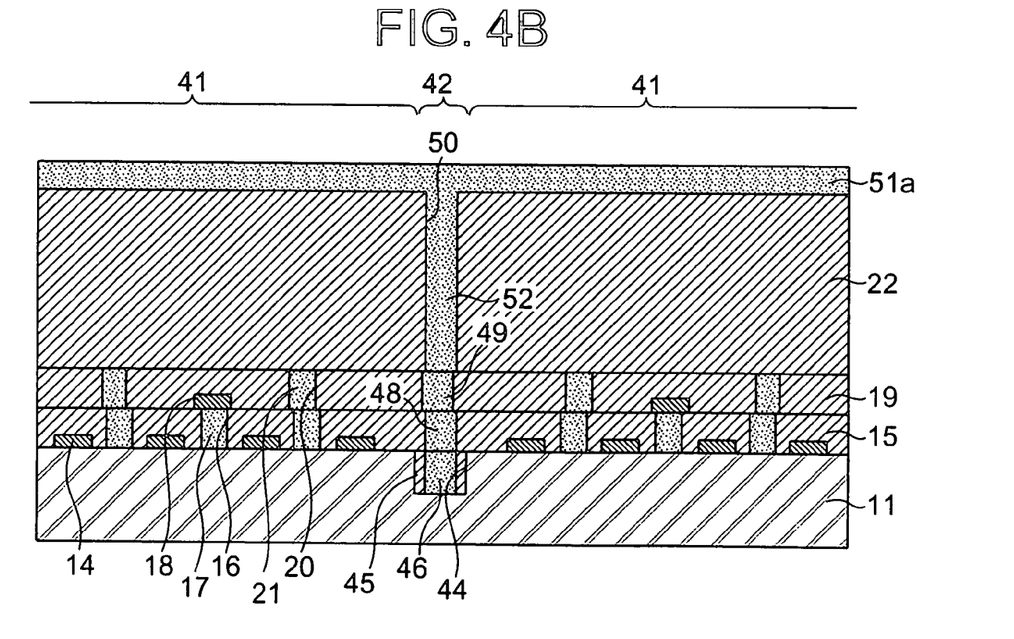

Thereafter, impurity-doped amorphous silicon is deposited on the thick insulation film 22 and in the plug holes 50 to a thickness of 0.5 μm to thereby form a conductive film 51a, as shown in FIG. 4B. Before this deposition, the hard mask may be removed from or left on the thick insulation film 22, as discussed in connection with the first embodiment. Subsequently, a heat treatment is conducted to change the amorphous silicon of the conductive film 51a into a polysilicon film. The portion of the conductive film 51a within the plug holes 50 configures third level electrode plugs 52.

Figure 4C:
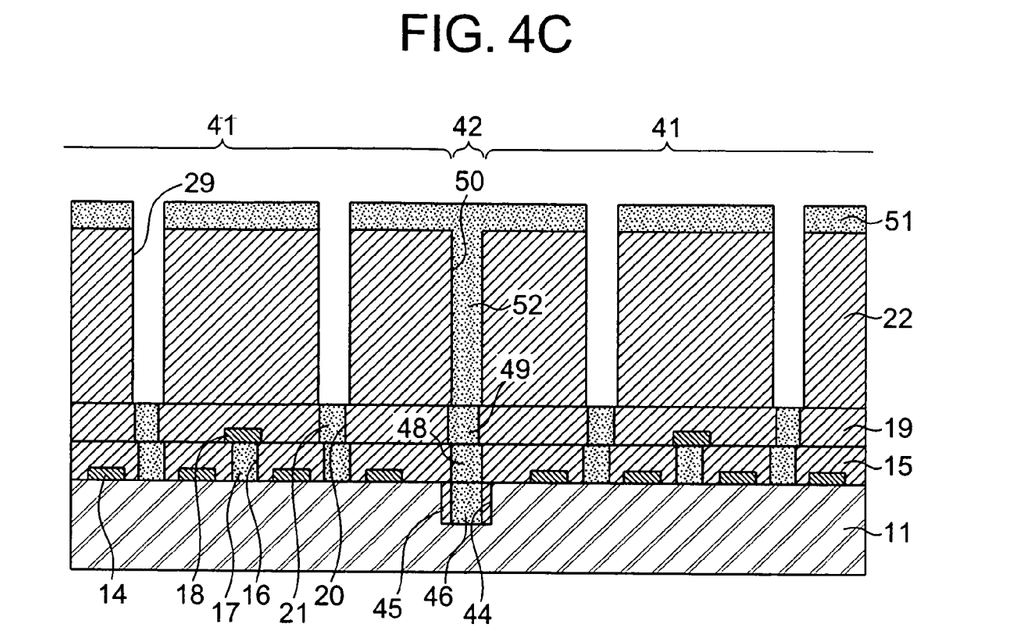
Figure 4D:
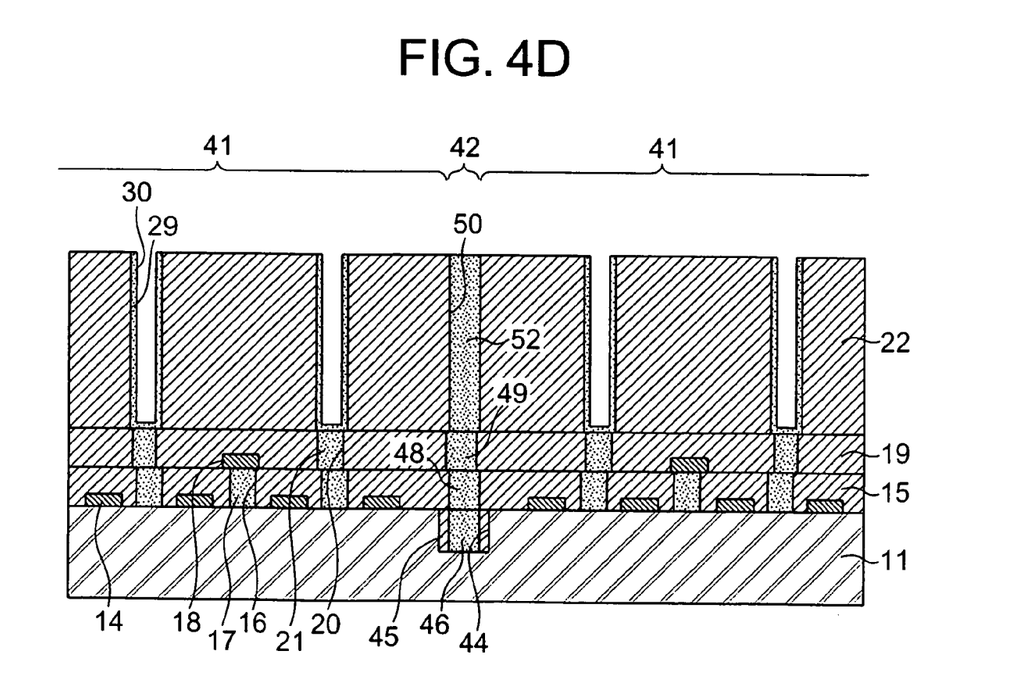

Thereafter, a photoresist mask (not shown) is formed on the conductive film 51a, similarly to the first embodiment, and is used for patterning the conductive film 51a to configure a conductive hard mask 51. Subsequently, as shown in FIG. 4C, a dry etching process is conducted using the conductive hard mask 51 as an etching mask to form cylindrical holes 29 in the thick insulation film 22.

Figure 4E:
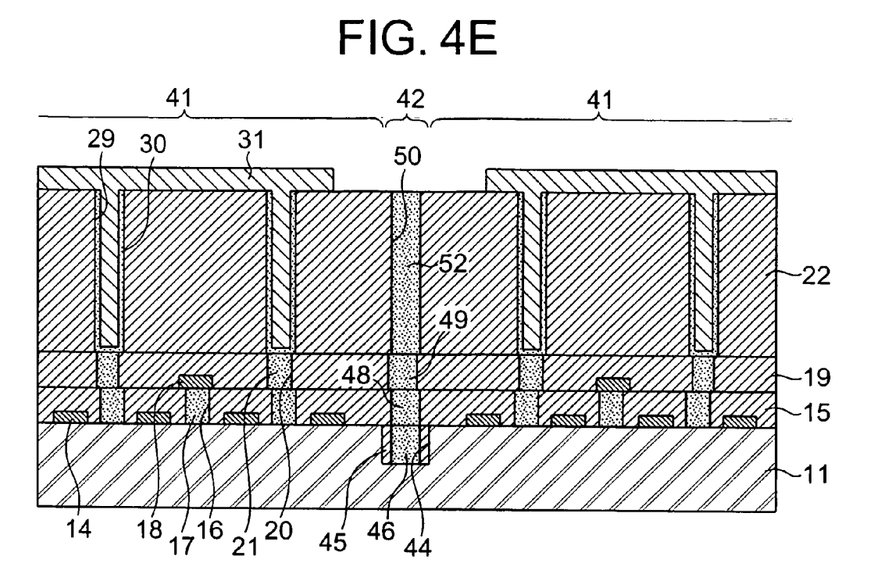

Thereafter, another conductive film is deposited on the thick insulation film 22 including the bottom and sidewall of the cylindrical holes 29, followed by removing a portion thereof formed on the thick insulation film 22 while leaving the other portion of the another conductive film as a bottom electrode 30 on the bottom and sidewall of the cylindrical holes 29. A thin insulation film (not shown) is then deposited on the entire surface including the surface of the bottom electrode 30, followed by forming another conductive film within the cylindrical holes 29 and on the thin insulation film. The thin insulation film and the another conductive film are then patterned to form the capacitor insulation film and the top electrode 31, as shown in FIG. 4E.

Thereafter, a third interlevel dielectric film 32 and via-plugs 36 are formed, similarly to the first embodiment. During formation of the via-plugs 36, fourth level electrode plugs 53 are formed on top of the third level electrode plugs 52. Subsequently, third level interconnects 37 are formed on the third interlevel dielectric film 32 to connect to the via-plugs 36 and fourth level electrode plugs 53.

Figure 4F:
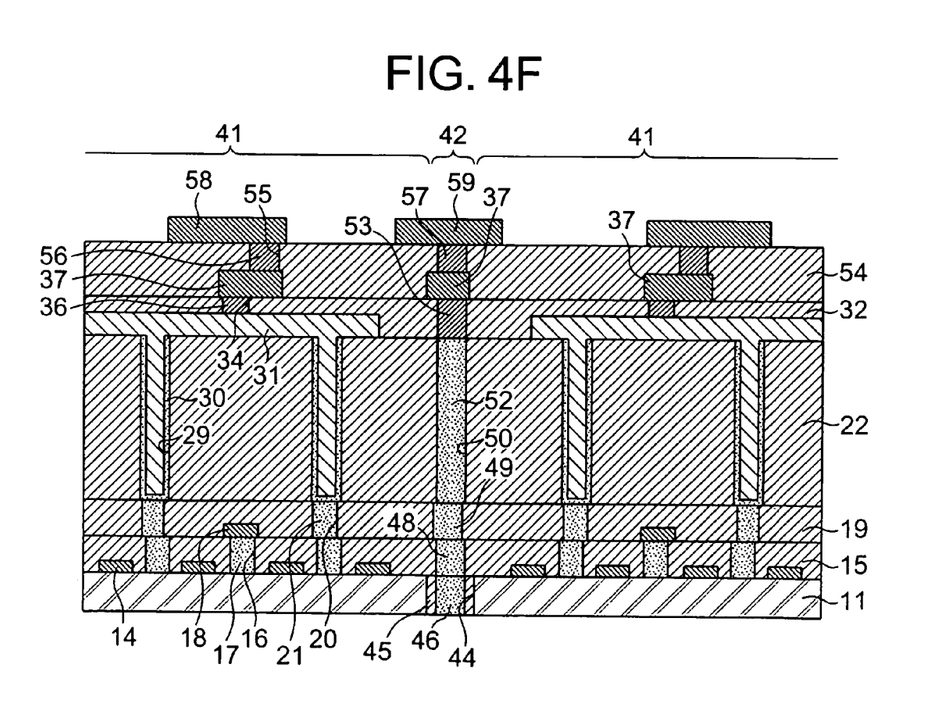

Thereafter, a fourth interlevel dielectric film 54 is deposited on the third interlevel dielectric film 32 and third level interconnects 37, and subjected to a CMP process for planarizing the surface thereof. The fourth interlevel dielectric film 54 is selectively etched to form therein via-holes 55 to expose therethrough the top of the third level interconnects 37 and fourth level electrode plugs 53. The via-holes 55 are then filled with a conductive material to form via-plugs 56 and fifth level electrode plugs 57. The via-plug 56 connects to the via-plugs 36 via the third level interconnects 37. The fifth level electrode plugs 57 connect to the fourth level electrode plugs 53 via the third level interconnects 37.

Thereafter, pad electrodes 58 and 59 are formed on the fourth interlevel dielectric film 54 to connect to the via-plugs 56 and fifth level electrode plugs 57. The first to fifth level electrodes 48, 49, 52, 53 and 57 configure a penetrating electrode plug attached with the pad electrode 59 and the embedded electrode 46. Subsequently, the bottom of the semiconductor substrate 11 is polished to expose the embedded electrodes 46 from the bottom of the semiconductor substrate 11, as shown in FIG. 4F. The resultant semiconductor wafer 11 is then subjected to dicing along the scribe areas 13 to divide the semiconductor wafer 11 into a plurality of semiconductor chips.

After packaging of a plurality of different semiconductor chips by stacking the semiconductor chip one on another, the penetrating electrodes of one of the semiconductor chips connect to the penetrating electrodes of an underlying semiconductor chip via the embedded electrodes 46, and connect to the penetrating electrodes of an overlying semiconductor chip via the pad electrodes 59.

In the present embodiment, the hard mask used for forming the cylindrical holes has an electric conductivity and connects to the semiconductor substrate via the penetrating electrodes. The penetrating electrodes are disposed in a uniform density over the entire wafer area to effectively suppress electrification of the conductive hard mask, thereby suppressing occurrence of the bowing structure.

Figure 5A:
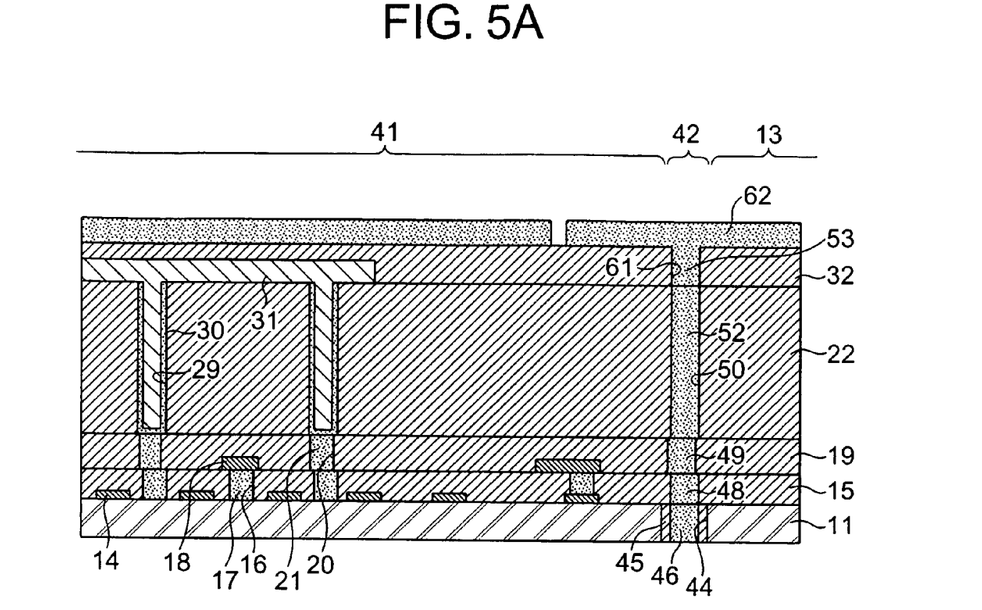
FIGS. 5A and 5B are sectional views consecutively showing fabrication steps of the semiconductor devices in a method according to a third embodiment of the present invention.
Figure 5B:
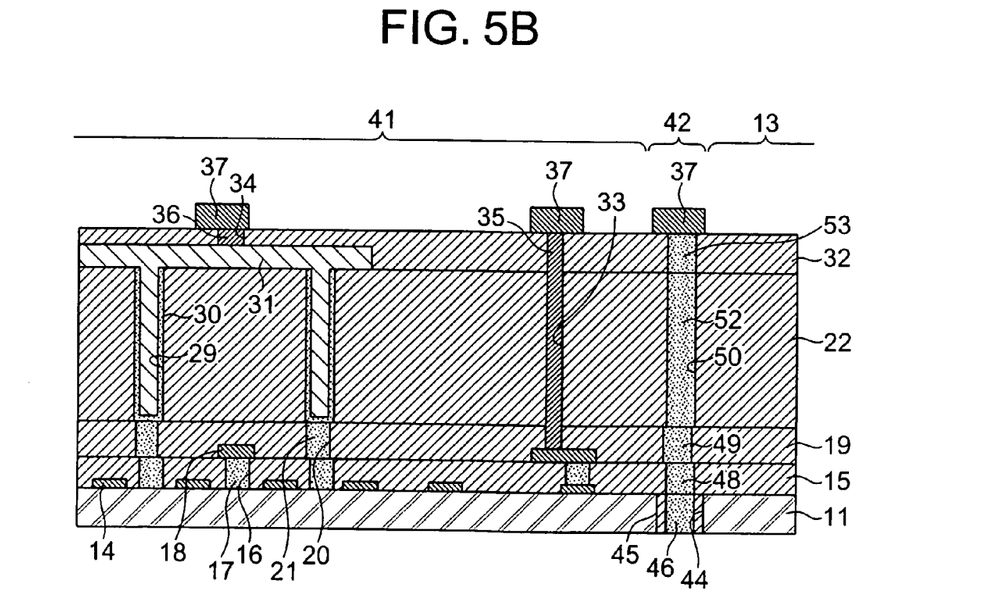

FIGS. 5A and 5B show a semiconductor device in consecutive steps of a process for manufacturing a semiconductor device according to a third embodiment of the present invention. FIGS. 5A and 5B show a section taken along line V-V in FIG. 3. In the present embodiment, the step for forming the via-holes 33 shown in FIG. 2H is conducted using the conductive hard mask coupled to the via-holes 33, as detailed below. The steps up to the step for depositing the third interlevel dielectric film 32 in the present embodiment are similar to those in the second embodiment.

Subsequent to deposition of the third interlevel dielectric film 32, the third interlevel dielectric film 32 is selectively etched to form plug holes 61 therein for exposing the third level electrode plugs 52. Impurity-doped amorphous silicon is then deposited on the third interlevel dielectric film 32 and within the plug holes 61 to form a conductive film. A heat treatment is conducted to polycrystallize the amorphous silicon of the conductive film. A portion of the polycrystallized conductive film embedded within the plug holes 61 configures the fourth level electrode plugs 53.

A photoresist film (not shown) is then formed on the polycrystallized conductive film, and patterned using a photolithographic step to form a photoresist mask. The photoresist mask is used in a dry etching for patterning the conductive film to thereby form the conductive hard mask 62, as shown in FIG. 5A.

Thereafter, the conductive hard mask 62 is used in a dry etching to selective etch the third interlevel dielectric film 32, thick insulation film 22 and second interlevel dielectric film 19, thereby forming through-holes 33. After removing the conductive hard mask 62 on the third interlevel dielectric film 32 by using a known technique, via-holes 34 are formed to expose a portion of the top electrodes 31.

Thereafter, tungsten is embedded within the through-holes 33 and via-holes 34 to form via-plugs 35 and 36. Third level interconnects 37 are then formed on the third interlevel dielectric film 32 to connect to the via-plugs 35, 36 and fourth level electrode plugs 53, as shown in FIG. 5B. Subsequent steps are similar to those in the second embodiment to obtain final semiconductor devices.

In the present embodiment, the hard mask 62 used for forming the through-holes has an electric conductivity, and is coupled to the semiconductor substrate 11 via the penetrating electrodes. This effectively prevents occurrence of the bowing structure caused by deviation of the positive ions from the perpendicular of the substrate surface.

In the second and third embodiments, the electrode plugs 48, 49, 52, 53, 57 are formed subsequent to the step of forming the interlevel dielectric films 15, 19, 22, 32, 54, respectively. These etching steps are conducted using the conductive hard mask coupled to the electrode plugs configuring the penetrating electrodes, whereby the bowing structure can be avoided.

In the second and third embodiments, the conductive hard mask may be provided with discharge plugs which are in contact with the conductive hard mask and the semiconductor substrate at both ends thereof, independently of the penetrating electrodes. The first embodiment may use the technique employed in the second and third embodiments, wherein the discharge plugs have a layered structure including a plurality of level electrode plugs corresponding to the interlevel dielectric films.

The conductive hard mask in the first through third embodiments may be replaced by an insulating hard mask so long as the discharge plugs are arranged in a uniform and higher density over the entire substrate area.

Since the above embodiments are described only for examples, the present invention is not limited to the above embodiments and various modifications or alterations can be easily made therefrom by those skilled in the art without departing from the scope of the present invention.

What is claimed is:

1. A method of manufacturing a semiconductor device comprising:
   forming an insulating film overlying a semiconductor substrate;
   forming an electrode plug penetrating said insulating film to reach said semiconductor substrate;
   forming mask pattern on said insulating film and on top of said electrode plug;
   selectively etching said insulating film by a dry etching using said mask pattern as an etching mask to form therein a cylindrical hole; and
   forming a first electrode in said cylindrical hole,
   wherein said mask pattern includes a conductive material.

2. The method according to claim 1, wherein said cylindrical hole has an aspect ratio of 14 or above.

3. The method according to claim 1, further comprising forming an electrode plug on a bottom of said first electrode.

4. The method according to claim 1, further comprising forming a capacitor including a top electrode, a capacitor insulation film and a bottom electrode configured by said first electrode.

5. The method according to claim 1, wherein said semiconductor device comprises a DRAM device.

6. The method according to claim 1, wherein said electrode plug is disposed in a chip area of a wafer or a vicinity of said chip area.

7. A method of manufacturing a semiconductor package comprising:
   manufacturing first and second semiconductor devices by using the method according to claim 1, and
   stacking said first semiconductor device onto said second semiconductor device so that said electrode plug of said first semiconductor device is in contact with said electrode plug of said second semiconductor device.

8. The method according to claim 1, wherein said forming said electrode plug comprises forming a trench using a plasma-enhanced etch and depositing a conductive film in said trench.

9. The method according to claim 1, wherein said forming a first electrode comprises depositing a conductive film in said cylindrical hole.

10. The method according to claim 6, wherein said forming said electrode plug comprises forming a plurality of said electrode plug arranged along a scribe area of a semiconductor wafer.

11. The method according to claim 6, wherein said forming said electrode plug comprises forming an elongate electrode plug extending along a scribe area of a semiconductor wafer.

12. The method according to claim 8, wherein said trench has an aspect ratio of less than 14.

13. The method according to claim 9, further comprising forming a second electrode by depositing a second conductive film in said cylindrical hole.

14. A method of manufacturing a semiconductor device comprising:
   forming an insulating film overlying a semiconductor substrate;
   forming an electrode plug penetrating said insulating film to reach said semiconductor substrate;
   forming a mask pattern on said insulating film and on top of said electrode plug;
   selectively etching said insulating film by a dry etching using said mask pattern as an etching mask to form therein a cylindrical hole; and
   forming a first electrode in said cylindrical hole,
   wherein said mask pattern is electrically coupled to said semiconductor substrate through said electrode plug.

15. A method of manufacturing a semiconductor device comprising:
   forming an insulating film overlying a semiconductor substrate;
   forming an electrode plug penetrating said insulating film to reach said semiconductor substrate;
   forming a mask pattern on said insulating film and on top of said electrode plug;
   selectively etching said insulating film by a dry etching using said mask pattern as an etching mask to form therein a cylindrical hole; and
   forming a first electrode in said cylindrical hole,
   wherein the semiconductor device comprises a plurality of chip areas separated by a plurality of scribe lines, and
   wherein said electrode plug is disposed along said scribe lines.

16. A method of manufacturing a semiconductor device comprising:
   forming an insulating film overlying a semiconductor substrate;
   forming an electrode plug penetrating said insulating film to reach said semiconductor substrate;
   forming a mask pattern on said insulating film and on top of said electrode plug;
   selectively etching said insulating film by a dry etching using said mask pattern as an etching mask to form therein a cylindrical hole;
   forming a first electrode in said cylindrical hole; and
   heat treating said conductive film,
   wherein said forming said electrode plug comprises forming a trench using a plasma-enhanced etch and depositing a conductive film in said trench.

17. A method of manufacturing a semiconductor device comprising:
   forming an insulating film overlying a semiconductor substrate;
   forming an electrode plug penetrating said insulating film to reach said semiconductor substrate;
   forming mask pattern on said insulating film and on top of said electrode plug;
   selectively etching said insulating film by a dry etching using said mask pattern as an etching mask to form therein a cylindrical hole; and
   forming a first electrode in said cylindrical hole,
   wherein said mask is patterned using orbicular-zone illumination.

18. A method of manufacturing semiconductor device comprising:
   forming an insulating film overlying a semiconductor substrate;
   forming an electrode plug penetrating said insulating film to reach said semiconductor substrate;
   forming a mask pattern on said insulating film and on top of said electrode plug;
   selectively etching said insulating film by a dry etching using said mask pattern as an etching mask to form therein a cylindrical hole; and
   forming a first electrode in said cylindrical hole,
   wherein said mask comprises impurity-doped silicon.

* * * * *